(12) United States Patent
Chu et al.

(10) Patent No.: US 11,474,128 B2
(45) Date of Patent: Oct. 18, 2022

(54) METAL PROBE STRUCTURE AND METHOD FOR FABRICATING THE SAME

(71) Applicant: PRINCO CORP., Hsinchu (TW)

(72) Inventors: Yi-Lin Chu, Hsinchu (TW); Hung-sheng Ku, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 150 days.

(21) Appl. No.: 16/747,557

(22) Filed: Jan. 21, 2020

(65) Prior Publication Data

US 2021/0123949 A1 Apr. 29, 2021

(30) Foreign Application Priority Data

Oct. 25, 2019 (TW) ................. 108138660

(51) Int. Cl.
*G01R 1/067* (2006.01)
*G01R 31/28* (2006.01)
*G03F 7/42* (2006.01)

(52) U.S. Cl.
CPC ..... *G01R 1/06761* (2013.01); *G01R 1/06716* (2013.01); *G01R 31/2886* (2013.01); *G03F 7/422* (2013.01)

(58) Field of Classification Search
CPC ............ G01R 1/06761; G01R 1/06716; G01R 1/06733; G01R 1/07307; G01R 31/2886; G01R 3/00; G03F 7/422; H05K 1/0393; H05K 3/46
See application file for complete search history.

(56) References Cited

U.S. PATENT DOCUMENTS

| | | | |
|---|---|---|---|
| 4,912,399 A | 3/1990 | Greub et al. | |
| 6,476,333 B1 * | 11/2002 | Khandros | H01L 23/49811 174/267 |
| 7,388,388 B2 | 6/2008 | Dong | |
| 7,737,707 B2 | 6/2010 | Sato et al. | |
| 8,485,418 B2 | 7/2013 | Eldridge et al. | |
| 8,519,534 B2 | 8/2013 | Chow | |
| 8,849,993 B2 | 9/2014 | Cooper et al. | |
| 9,622,344 B2 | 4/2017 | Inoue et al. | |

(Continued)

FOREIGN PATENT DOCUMENTS

| | | | |
|---|---|---|---|
| CN | 102384992 | * | 3/2012 |
| CN | 102455373 A | | 5/2012 |

(Continued)

OTHER PUBLICATIONS

English Machine Translation of Chen et al. CN 102384992 (Chen) (Year: 2012).*

*Primary Examiner* — Lee E Rodak
(74) *Attorney, Agent, or Firm* — Mark M. Friedman

(57) ABSTRACT

A metal probe structure and a method for fabricating the same are provided. The metal probe structure includes a multi-layer substrate, a first flexible dielectric layer, a second flexible dielectric layer, and a plurality of first metal components. The first flexible dielectric layer is disposed over the multi-layer substrate and has a conductive layer formed thereover. The second flexible dielectric layer is disposed over the first flexible dielectric layer to cover the conductive layer. The plurality of first metal components is disposed over the conductive layer and partially in the second flexible dielectric layer to serve as a metal probe.

18 Claims, 13 Drawing Sheets

(56) References Cited

U.S. PATENT DOCUMENTS

| | | |
|---|---|---|
| 10,451,654 B2 | 10/2019 | Yang et al. |
| 2002/0005728 A1* | 1/2002 | Babson .............. G01R 1/06744 |
| | | 324/755.05 |
| 2005/0093176 A1 | 5/2005 | Hung |
| 2005/0269697 A1 | 12/2005 | Yuzawa et al. |
| 2006/0257631 A1* | 11/2006 | Chang ................. H05K 3/4647 |
| | | 428/195.1 |
| 2007/0103177 A1 | 5/2007 | Chen |
| 2007/0200574 A1 | 8/2007 | Sato |
| 2009/0051041 A1* | 2/2009 | Otsuka .............. H01L 23/49822 |
| | | 257/774 |
| 2010/0176396 A1 | 7/2010 | Wada |
| 2012/0058653 A1 | 3/2012 | Rathburn |
| 2012/0286817 A1 | 11/2012 | Duckworth |
| 2016/0091532 A1 | 3/2016 | Song et al. |

FOREIGN PATENT DOCUMENTS

| | | |
|---|---|---|
| CN | 110136617 A | 8/2019 |
| JP | S644042 A | 1/1989 |
| JP | 2004301527 A | 10/2004 |
| JP | 2006078495 A | 3/2006 |
| JP | 2006507479 A | 3/2006 |
| JP | 2006189430 A | 7/2006 |
| JP | 2007173846 A | 7/2007 |
| JP | 2008128882 A | 6/2008 |
| KR | 20070010187 A | 1/2007 |
| KR | 20100048673 A | 5/2010 |
| KR | 20120031141 A | 3/2012 |
| TW | I276805 B | 3/2007 |
| TW | I393890 B | 4/2013 |
| TW | I489916 B | 6/2015 |
| TW | I663406 B | 6/2019 |

* cited by examiner

METAL PROBE STRUCTURE AND METHOD FOR FABRICATING THE SAME

FIELD OF INVENTION

The present invention relates to an integrated circuit (IC) testing device, and more particularly to a metal probe structure for a probe card used in IC testing and a method for fabricating the same.

BACKGROUND

With rapid development of integration of integrated circuit technology, packaging technology has reached an unprecedented and innovative technical level.

Electrical tests of packaged integrated circuits are mainly achieved by a probe card. In conventional technology, lifetimes of testing probes in a probe card are affected by ambient temperature, mechanical actuation, and current resistance, and testing probes thereof cannot overcome measurement errors caused by the above effects.

In addition, when conventional testing probes are used for wafer testing, there are demands, such as compliance and amount of displacement that the testing probes can withstand, so that the testing probes should have elasticity, that is, the ability to deform itself to adapt to height differences between various points to be measured. Due to the above demands, the testing probes must have a fine diameter. As a result, the ability of the testing probes to withstand current is bound to be limited. This ability to withstand large currents is a key factor when applied to test high frequency products such as 5G high frequency chips. Since the testing probes are formed with a large number, short-circuiting of the testing probes may be caused during operation, which may affect the measurement or even damage the circuit function, thereby adversely affecting the function of the probe card and the test results.

In addition, testing probes with its own deformability encounter problems such as a pitch that cannot be further reduced and rising costs under the trend that the contact points over the dies fabricated by modern semiconductor process become more and more, and a distance between the contact points is getting less and less.

Therefore, there is a need for a probe structure that can shorten the pitch between the probes, improve reliability, and increase current resistance, heat dissipation, and/or mechanical strength to overcome the above drawbacks.

SUMMARY

In view of this, the present invention provides a metal probe structure and a method for fabricating the same to provide. A probe structure for a probe card having better reliability, current resistance, heat dissipation and/or mechanical strength can be provided. With the multi-layer flexible substrate possessed by the metal probe structure, the compliance can be achieved, and the metal probe with high rigidity and high current resistance can be adapted to the height difference of the points to be tests.

According to an embodiment, a metal probe structure comprises a multi-layer substrate, a first flexible dielectric layer, a second flexible dielectric layer, and a plurality of first metal components. The first flexible dielectric layer is disposed over the multi-layer substrate and has a conductive layer formed thereover. The second flexible dielectric layer is disposed over the first flexible dielectric layer to cover the conductive layer. The plurality of first metal components is disposed over the conductive layer and partially in the second flexible dielectric layer to serve as a metal probe.

According to another embodiment, a metal probe structure comprises a multi-layer substrate, a first flexible dielectric layer, a second flexible dielectric layer, and a plurality of metal stacks. The first flexible dielectric layer is disposed over the multi-layer substrate, and has a conductive layer formed thereover. The second flexible dielectric layer is disposed over the first flexible dielectric layer to cover the conductive layer. The plurality of metal stacks are respectively disposed over the conductive layer and partially located in the second flexible insulating layer, wherein the metal stacks respectively comprise a plurality of first metal components and a plurality of second metal components that are interleaved with each other from bottom to top.

According to another embodiment, a method for fabricating a metal probe structure comprises the following steps of: providing a multi-layer substrate having a first flexible dielectric layer and a conductive layer sequentially formed thereover; forming a second flexible dielectric layer over the first flexible dielectric layer, covering the conductive layer; forming a plurality of first openings in the second flexible dielectric layer, wherein the first openings respectively exposing a portion of the conductive layer; forming a patterned photoresist layer over the second flexible dielectric layer, wherein the patterned photoresist layer has a plurality of second openings respectively located over the first openings, and the second openings respectively expose the first openings and the portion of the conductive layer exposed during formation of the first openings; forming a first metal component in each of the first openings, wherein the first metal component respectively fills the first openings and physically contacts the conductive layer; removing the patterned photoresist layer; and performing an etching process, removing a portion of the second flexible dielectric layer and all the flexible dielectric layers over the second flexible dielectric layer to expose a portion of the first metal components to form a metal probe.

The method for fabricating a metal probe structure of the embodiment of the invention and the metal probe structure formed by thereof is a composite metal probe structure made of a plurality of metal components formed by stacking a plurality of metal components and a metal layer physically connecting the metal stacks. In this way, properties of the metal probe structure including but not limited to such as the material, the number of layers, the pitch, and the aspect ratio of the metal stack and the metal layer can be designed and adjusted according to the type of the test wafer, thereby providing a metal probe with good reliability, electrical conductivity, heat dissipation and/or mechanical strength than the metal probe used in the conventional probe card. With the multi-layer flexible substrate possessed by the metal probe structure, the compliance effect can be achieved, and the metal probe with high rigidity and high current resistance can be adapted to the height differences of the testing points to be measured.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

The embodiments of the present invention are described below by way of specific examples, and those skilled in the art can understand the advantages and effects of the present invention from the disclosure of the present specification. The present invention may be carried out or applied in various other specific embodiments, and various modifications and changes can be made without departing from the spirit and scope of the invention. In addition, the drawings of the present invention are merely illustrative and are not intended to be construed in terms of actual dimensions. The following embodiments will further explain the related technical content of the present invention, but the disclosure is not intended to limit the technical scope of the present invention.

FIG. 1-9 are schematic cross-sectional views showing a method for fabricating a metal probe structure in accordance with an embodiment of the present invention.

Figure 1:
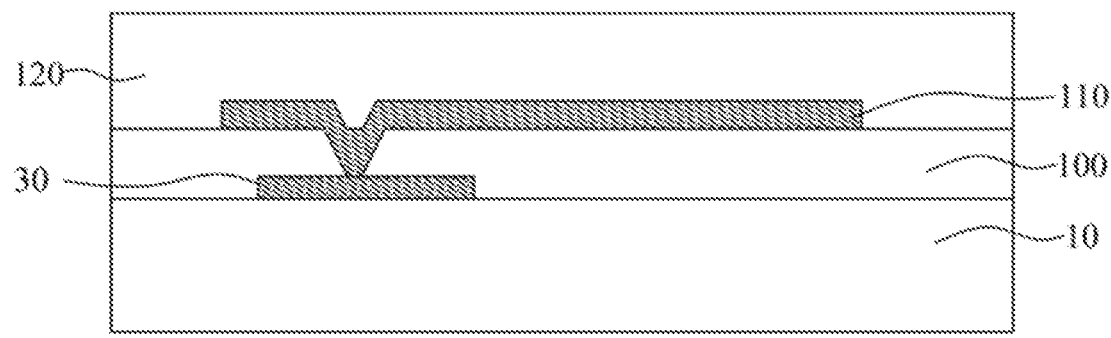
FIG. 1-9 are schematic cross-sectional views showing a method for fabricating a metal probe structure in accordance with an embodiment of the present invention.

Referring to FIG. 1, a multi-layer substrate 10 is first provided, having a first flexible dielectric layer 100 and a conductive layer 110 sequentially formed thereover. A conductive layer 30 is formed between the multi-layer substrate 10 and the flexible dielectric layer 100, which is connected to the conductive layer 110. A second flexible dielectric layer 120 is then formed over the first flexible dielectric layer 100 to cover the conductive layer 110.

In one embodiment, the multi-layer substrate 10 is, for example, a flexible multi-layer substrate comprising a plurality of flexible dielectric layers and conductive layers (both not shown) that are sequentially interleaved to function as a probe card substrate having a multi-layer interconnect structure. The flexible dielectric layer uses polyimide (PI) having a low dielectric constant, and the conductive layer uses a metal line to function as a subsequent electrical connection.

Figure 2:
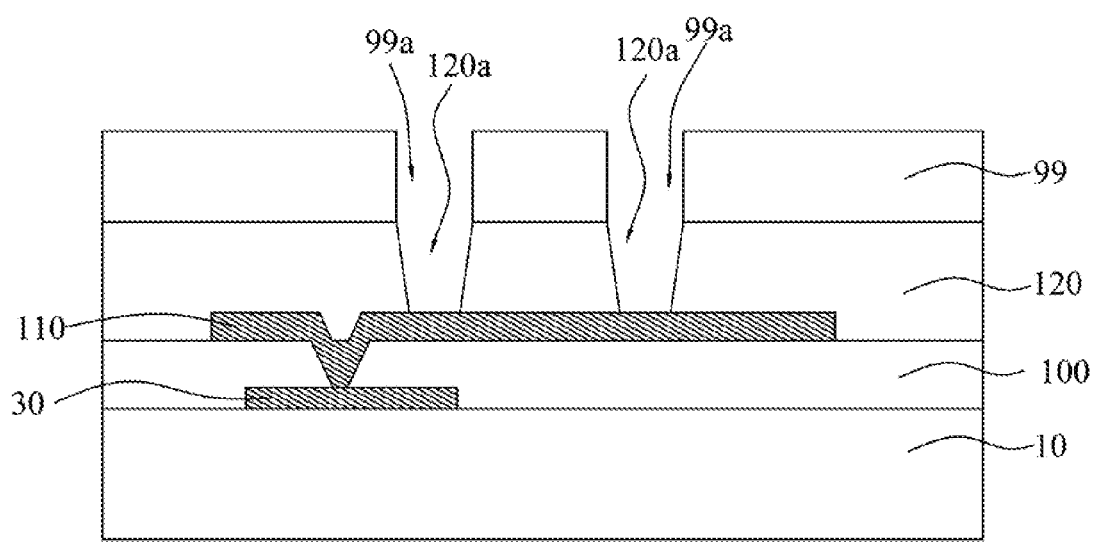

Referring to FIG. 2, a plurality of first openings 120a are formed in the second flexible dielectric layer 120, and the first openings 120a respectively expose a portion of the conductive layer 110. Then, a patterned photoresist layer 99 is formed over the second flexible dielectric layer 120, and the patterned photoresist layer 99 comprises a plurality of second openings 99a respectively located over the first openings 120a and respectively exposing the first openings 120a and a portion of the conductive layer 110 exposed by the first openings 120a. Here, the number of the first opening 120a and the second opening 99a are illustrated by two as an example, but is not limited thereto.

Figure 3:
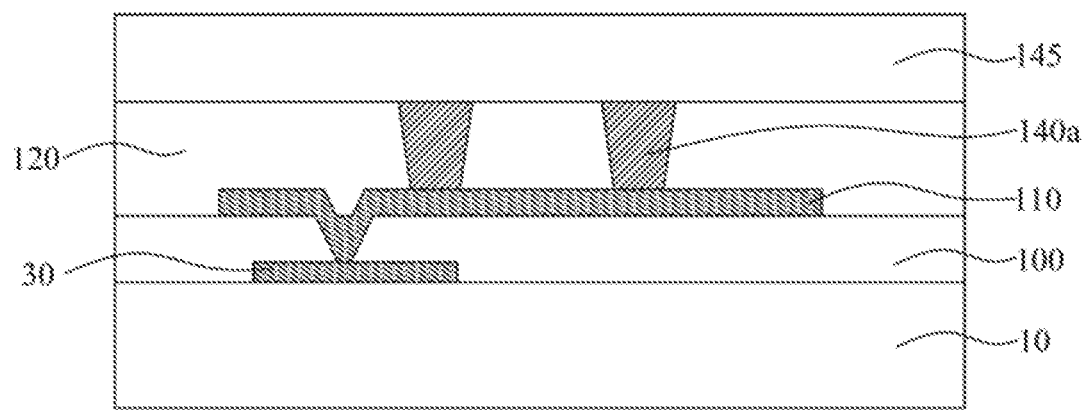

Referring to FIG. 3, a first metal component 140a is formed in each of the first openings 120a. Here, the first metal member 140a fills the first openings 120a and physically contacts the conductive layer 110. After the patterned photoresist layer 99 (see FIG. 2) is removed, a third flexible dielectric layer 145 is formed over the second flexible dielectric layer 120 and covers the first metal components 140a.

Figure 4:
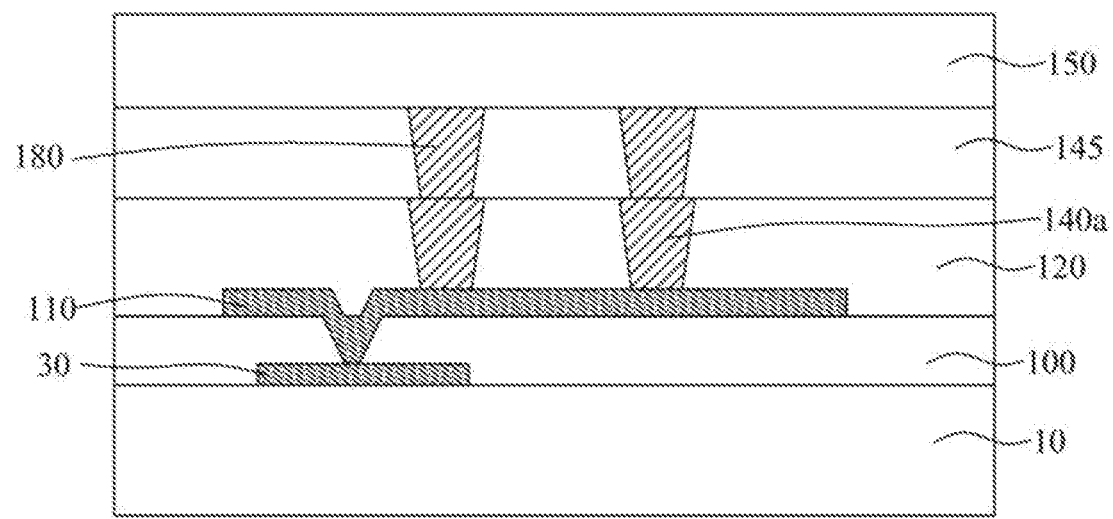

Referring to FIG. 4, a plurality of first metal components 180 are formed in the third flexible dielectric layer 145. The first metal components 180 can be obtained by repeating the steps in FIGS. 2 to 3 once, and the formed first metal components 180 are respectively located over the previous first metal components 140a. A third flexible dielectric layer 150 is then formed over the third flexible dielectric layer 145 and the first metal features 140a.

Figure 5:
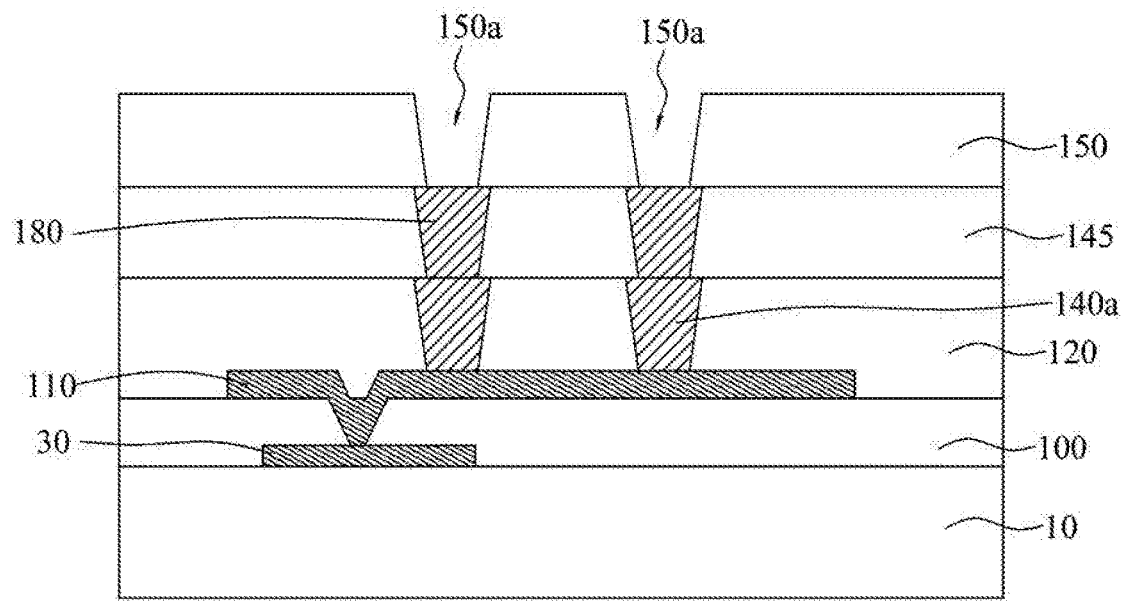
Figure 6:
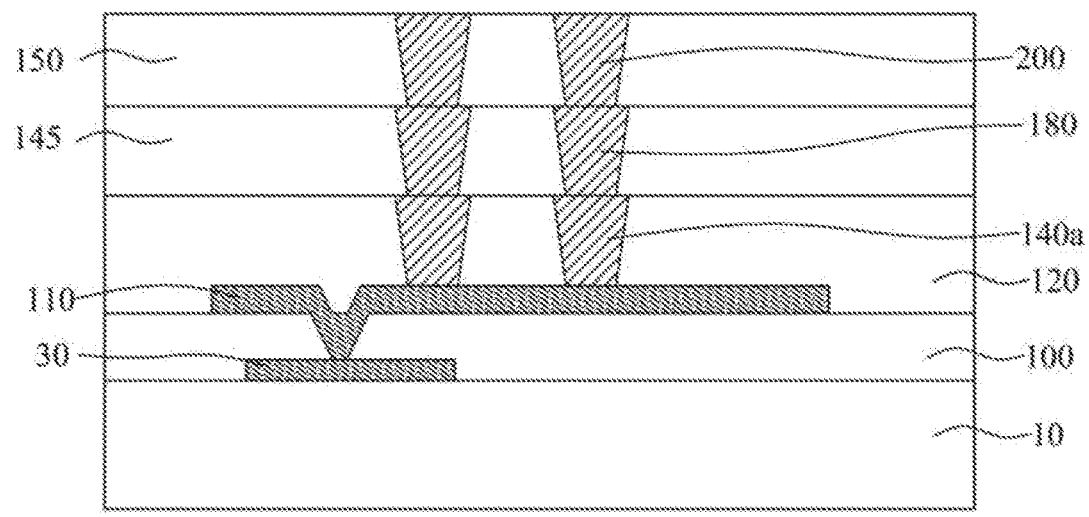
Figure 8:
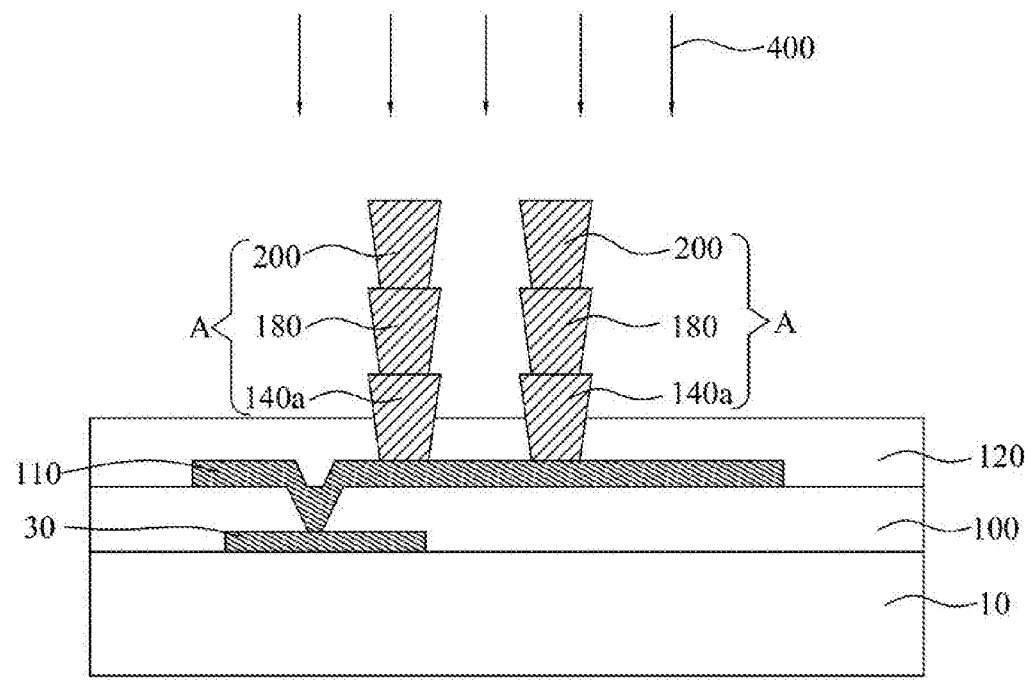

Referring to FIG. 5-6, the steps shown in FIG. 2 to FIG. 3 can be repeated once, and a plurality of third openings 150a are formed in the third flexible dielectric layer 150 to respectively expose each of the first metal components 180, a first metal component 200 is then formed in the third openings 150a, respectively, to form a plurality of metal stacks comprising a plurality of first metal components 140a, 180, and 200 which are sequentially stacked (see FIG. 8).

In this embodiment, the first flexible dielectric layer 100, the second flexible dielectric layer 120, 145 and the third flexible dielectric layer 150 comprise polyimide, and the first metal components 140a, 180, and 200 comprise copper or aluminum, and can be formed by, for example, evaporation deposition. The first metal components 140a, 180, and 200 have a maximum width of about 5 to 200 micrometers and a maximum height of about 5 to 100 micrometers, respectively, and the metal stacks A have an aspect ratio of 0.5:1 to 5:1, respectively.

Figure 7:
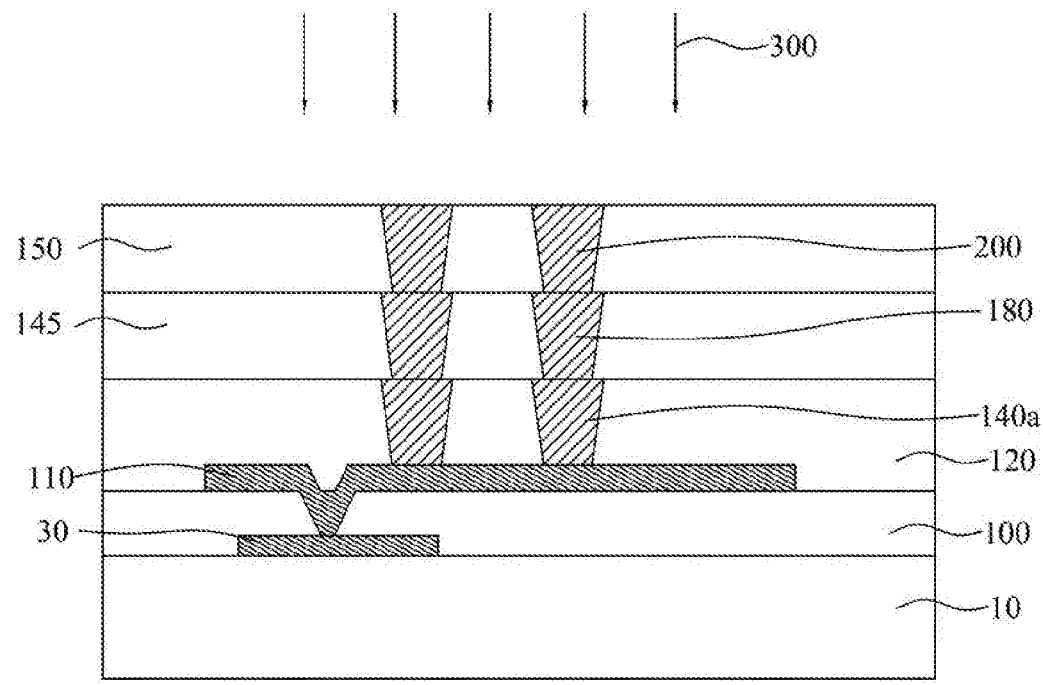

Referring to FIG. 7, an annealing process 300 is then performed to the metal stacks A (see FIG. 8) comprising the plurality of first metal elements 140a, 180, and 200 sequentially stacked, which is performed at a temperature of about 100-350° C.

Referring to FIG. 8, an etching process 400 is then performed to remove the third flexible dielectric layers 150 and 145, and a portion of the second flexible dielectric layer 120 to expose a portion of the metal stack A comprising these first metal components 140a, 180 and 200, and the first metal components 140a, 180, and 200 are already able to function as metal probes. In the present embodiment, the etching process 400 is, for example, dry etching using an etching gas such as fluoride or oxygen, and the metal stacks A have a pitch of 5 to 100 μm.

Figure 9:
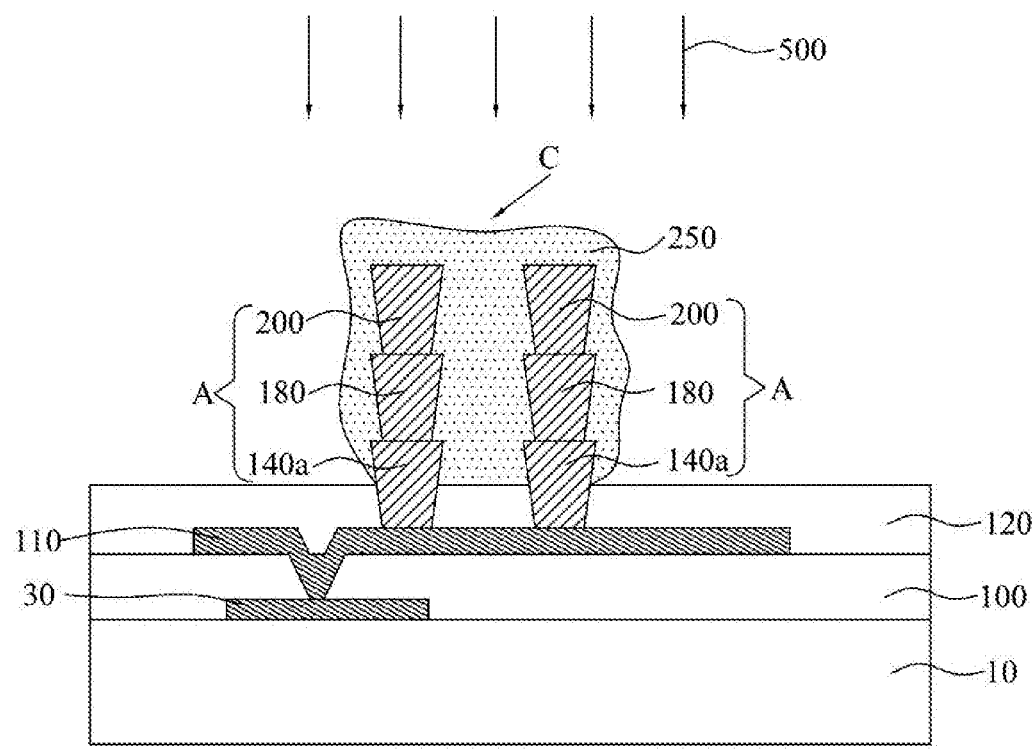

Referring to FIG. 9, an optional electroplating process 500 can be next performed to form a metal layer 250 over the side and top surfaces of the metal stacks A to physically combine the metal stacks A, thereby forming these metal stacks A into a metal probe C. In this present embodiment, the electroplating process 500 can be, for example, an electroless plating process, and the metal layer 250 may comprise nickel, palladium, gold, and alloys thereof. In addition, the thickness of each film layer can be appropriately adjusted, so that the formed metal probe C may have an aspect ratio of 1:1 to 5:1.

FIG. 10-19 are schematic cross-sectional views showing a method for fabricating a metal probe structure in accordance with another embodiment of the present invention.

Figure 10:
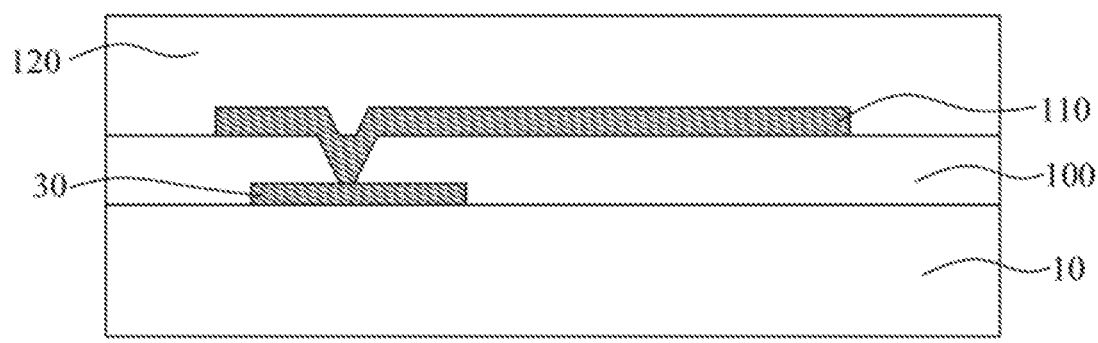
FIG. 10-19 are schematic cross-sectional views showing a method for fabricating a metal probe structure in accordance with another embodiment of the present invention.

Referring to FIG. 10, a multi-layer substrate 10 is first provided, and a first flexible dielectric layer 100 and a conductive layer 110 are sequentially formed thereover. A conductive layer 30 is formed between the multi-layer substrate 10 and the flexible dielectric layer 100. The conductive layer 30 is physically connected to the conductive layer 110. A second flexible dielectric layer 120 is then formed over the first flexible dielectric layer 100 to cover the conductive layer 110.

In one embodiment, the multi-layer substrate 10 can be, for example, a flexible multi-layer substrate comprising a plurality of flexible dielectric layers and conductive layers (both not shown) which are sequentially interleaved to function as a probe card substrate having a plurality of interconnect structures, wherein the flexible dielectric layers use polyimide (PI) having a low dielectric constant, and the conductive layers use a metal line for subsequent electrical connections.

Figure 11:
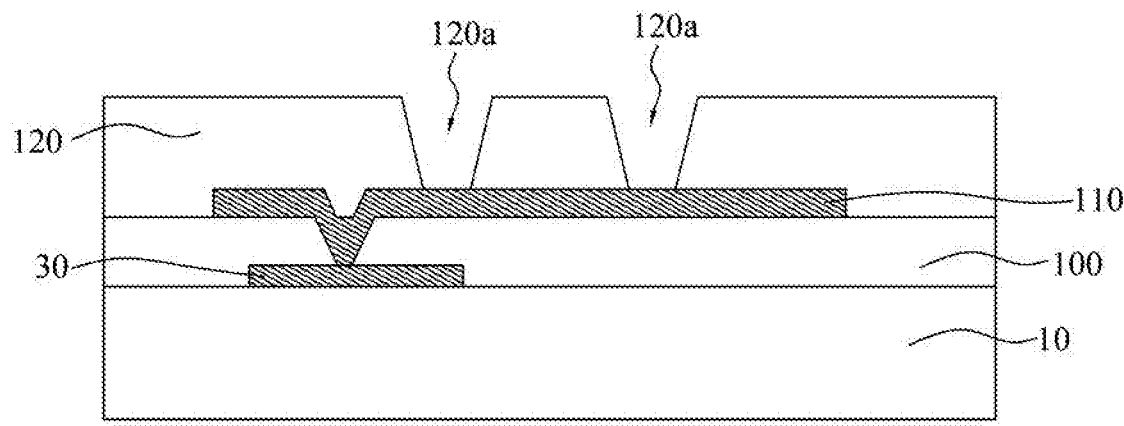

Referring to FIG. 11, a plurality of first openings 120a are formed in the second flexible dielectric layer 120, and the first openings 120a respectively expose a portion of the conductive layer 110. Here, the number of the first openings 120a are illustrated by two as an example, but is not limited thereto.

Figure 12:
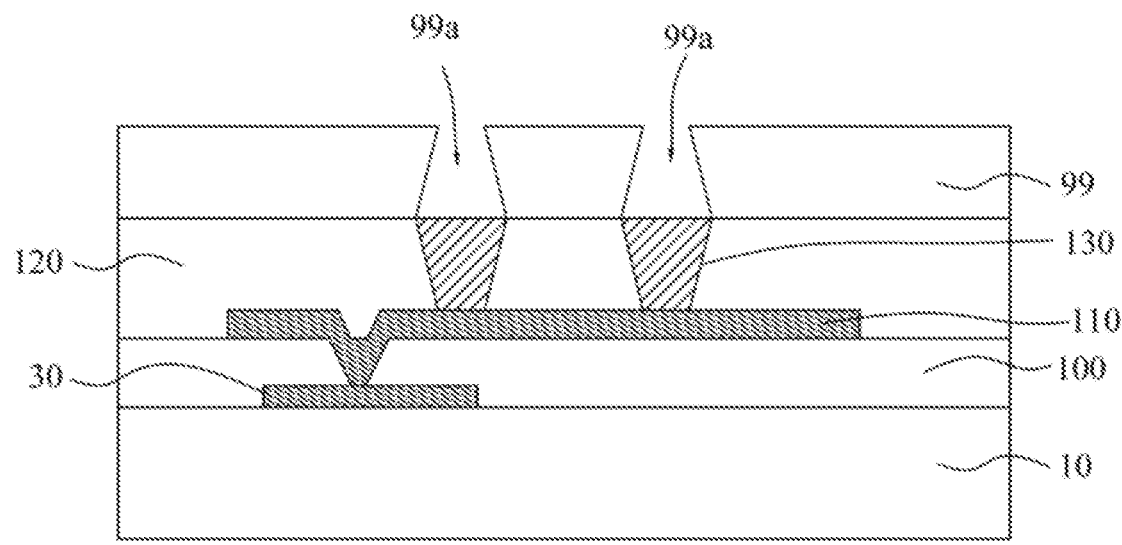

Referring to FIG. 12, a first metal component 130 is formed in each of the first openings 120a. The first metal component 130 fills in the first openings 120a and physically contacts the conductive layer 110. Then, a patterned photoresist layer 99 is formed over the second flexible dielectric layer 120, wherein the patterned photoresist layer 99 has a plurality of second openings 99a respectively exposing the first metal components 130 located in the first openings 120. Here, the number of the second openings 99a is illustrated by two, but is not limited thereto.

Figure 13:
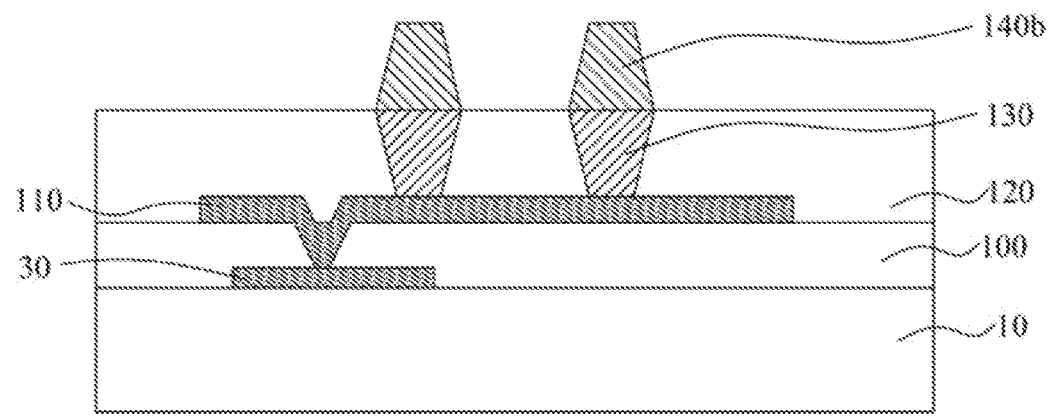

Referring to FIG. 13, a second metal component 140b is formed in each of the second openings 99a. Here, the second metal component 140b fills the second openings 99a and physically contacts one of the first metal components 130. Next, after the patterned photoresist layer 99 is removed, the second metal component 140b is left over each of the first metal components 130.

Figure 14:
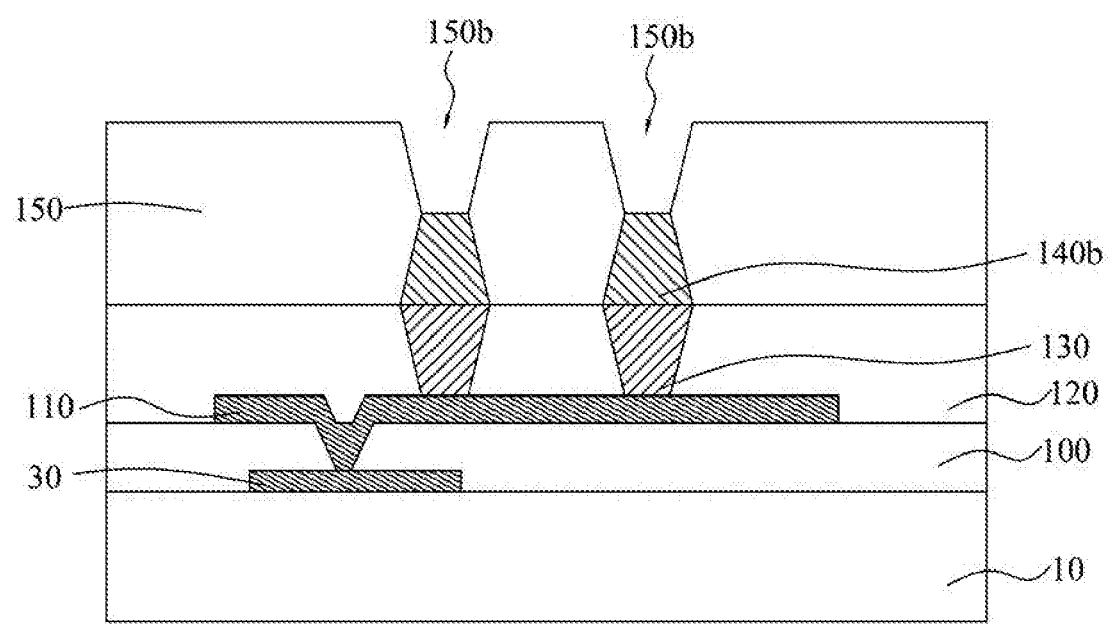

Referring to FIG. 14, a patterned third flexible dielectric layer 150 is formed on the second flexible dielectric layer 120 and covers the second metal components 140b, wherein the patterned third flexible dielectric layer 150 comprises a plurality of third openings 150b that respectively expose one of the second metal members 140b. Here, the number of the third openings 150b is illustrated by two as an example, but is not limited thereto.

Figure 15:
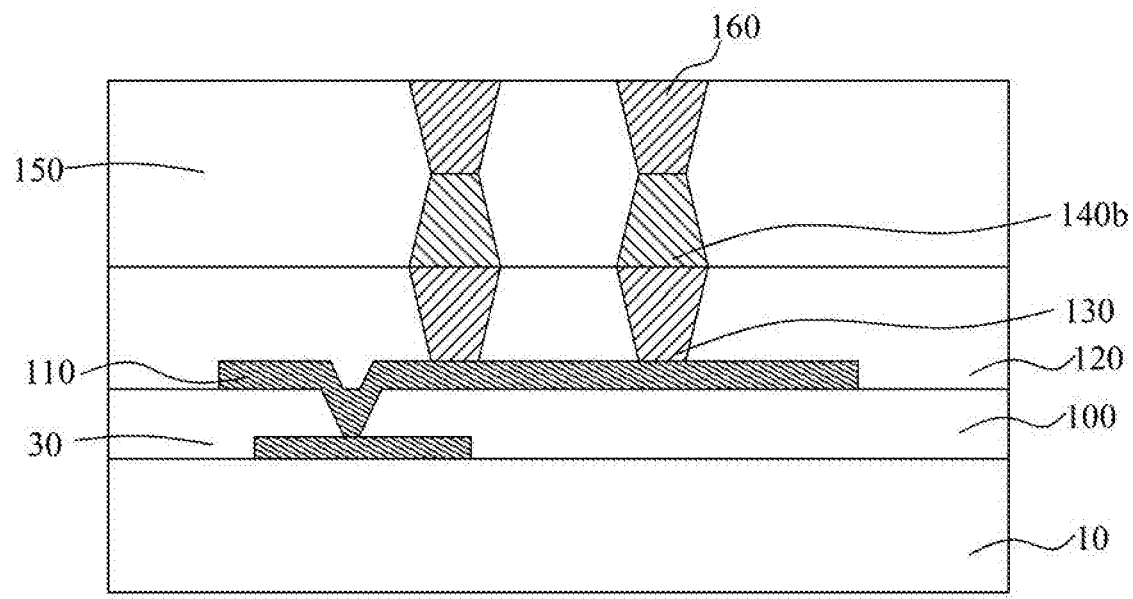

Referring to FIG. 15, another first metal component 160 is formed in the third openings 150b. The first metal component 160 fills each of the third openings 150b and physically contacts the second metal component 140b.

Figure 16:
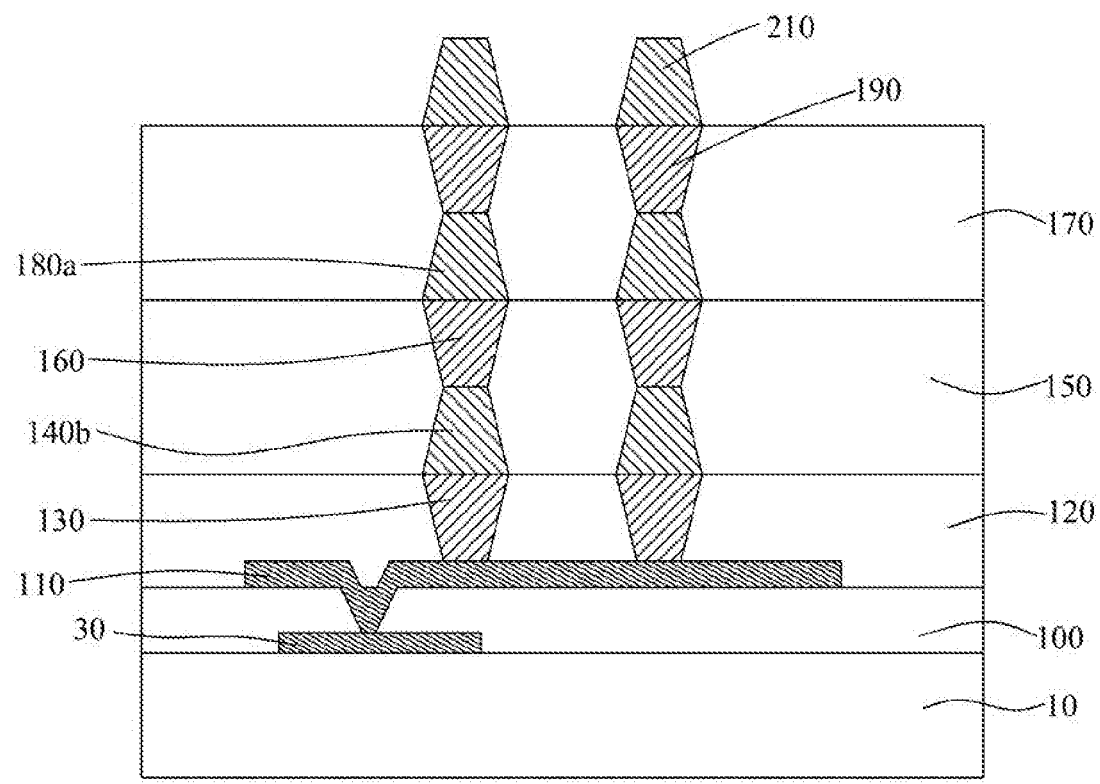

Referring to FIG. 16, the fabrication method shown in FIG. 12-15 can be repeated again, and another third flexible dielectric layer 170 over the third flexible dielectric layer 150 and a plurality of second metal components 180a in the third flexible dielectric layer 170 are formed. The second metal components 180a and first metal components 190 are disposed in the same location and stacking relationship as the second metal component 140a and the first metal component 160 located in the third flexible dielectric layer 170, and the second metal components 180a physically contacts one of the first metal components 160 below, respectively. Then, the fabrication method shown in FIG. 12-13 can be further repeated to form the second metal component 210 respectively located over the first metal component 160, thereby forming a plurality of metal stacks A' (see FIG. 18) comprising a plurality of first metal components 130, 160, and 190 and a plurality of second metal elements 140a, 180a and 210.

In this embodiment, the first flexible dielectric layer 100, the second flexible dielectric layer 120, 150, and the third flexible dielectric layer 170 comprise polyimide, and the first metal components 130, 160, and 190 comprise copper or aluminum and can be formed by, for example, evaporation deposition. The first metal components 130, 160, and 190 have a maximum width of 5 to 200 micrometers and a maximum height of 5 to 100 micrometers, respectively. In addition, the second metal components 140a, 180a, and 210 comprise nickel, palladium, gold, and alloys thereof, and may be formed by, for example, chemical electroless plating. The second metal components 140a, 180a, and 210 have a maximum width of 5 to 200 micrometers and a maximum height of 5 to 100 micrometers, respectively.

Figure 17:
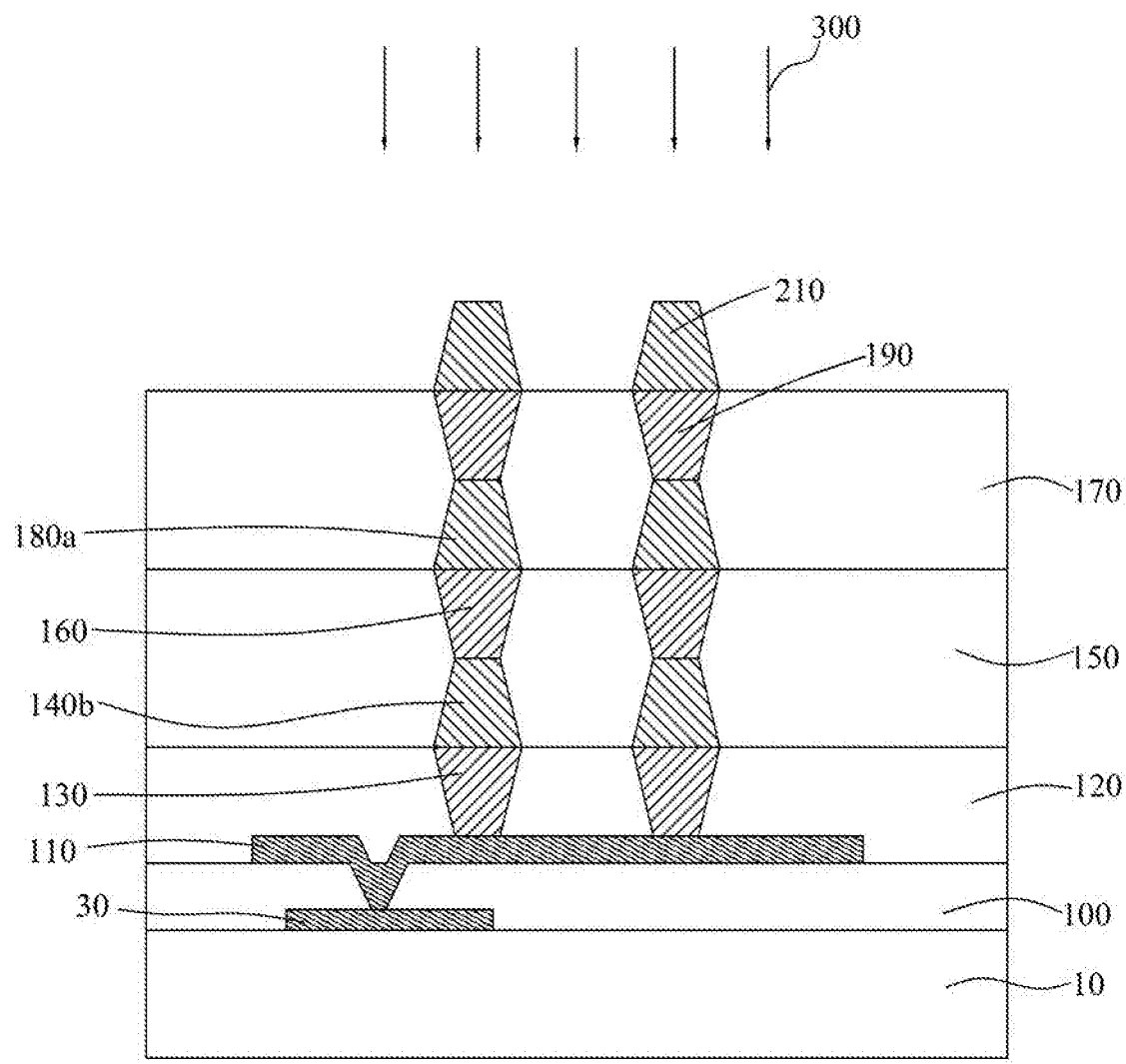

Referring to FIG. 17, an annealing process 300 is performed to the metal stacks A' (see FIG. 18) comprising the plurality of first metal elements 130, 160, and 180, and the plurality of first metal elements 140a, 180, and 210 sequentially stacked, which is performed at a temperature of about 100-350° C.

Figure 18:
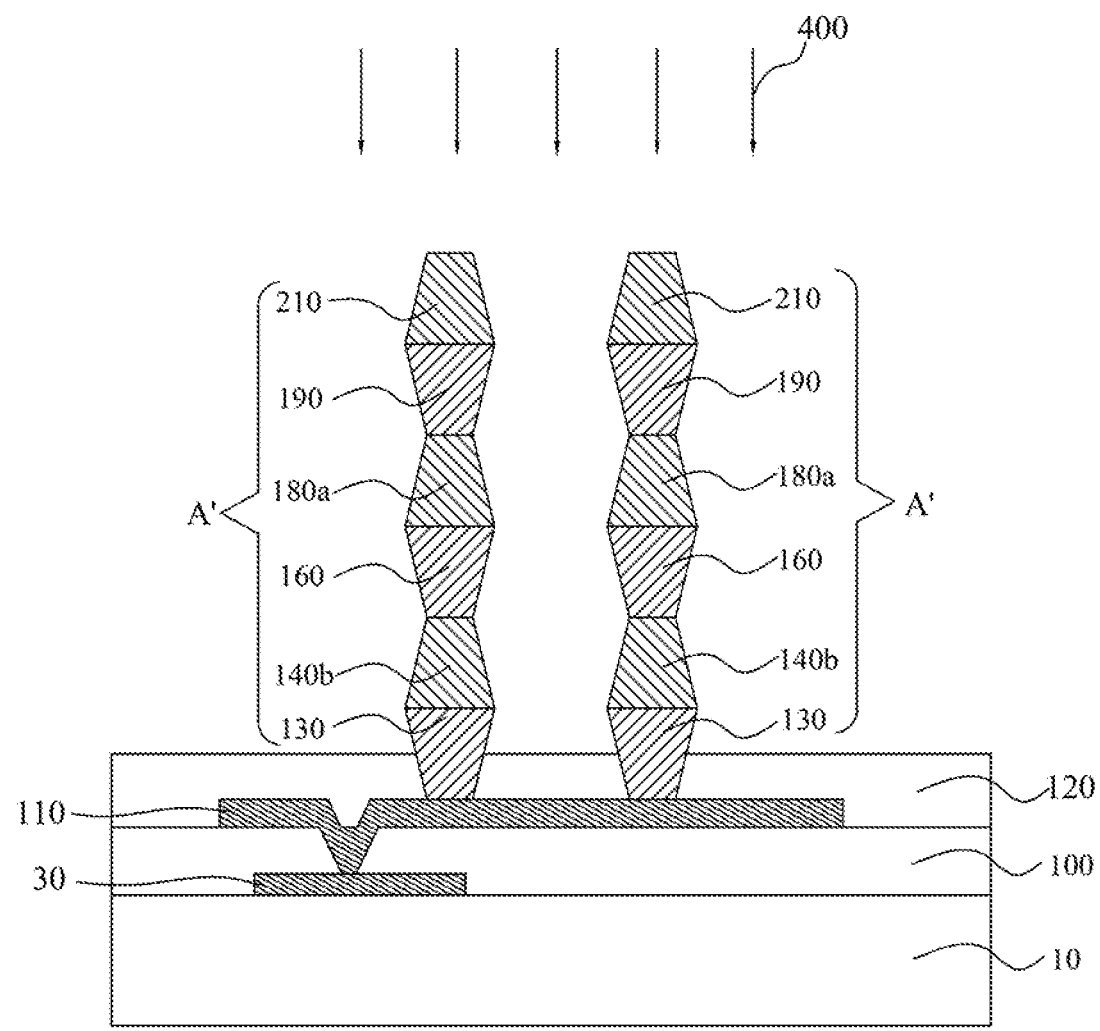

Referring to FIG. 18, an etching process 400 is performed to remove the third flexible dielectric layer 170, 150, and a portion of the second flexible dielectric layer 120, thereby exposing a portion of the metal stacks A' (see FIG. 18) comprising the plurality of first metal elements 130, 160, and 180, and the plurality of first metal elements 140a, 180, and 210. In the present embodiment, the etching process 400 is, for example, dry etching using an etching gas including fluoride, oxygen, etc., and the metal stacks A' have a pitch of 5 to 100 μm, and the metal stacks have an aspect ratio of 0.5:1-5:1, respectively.

Figure 19:
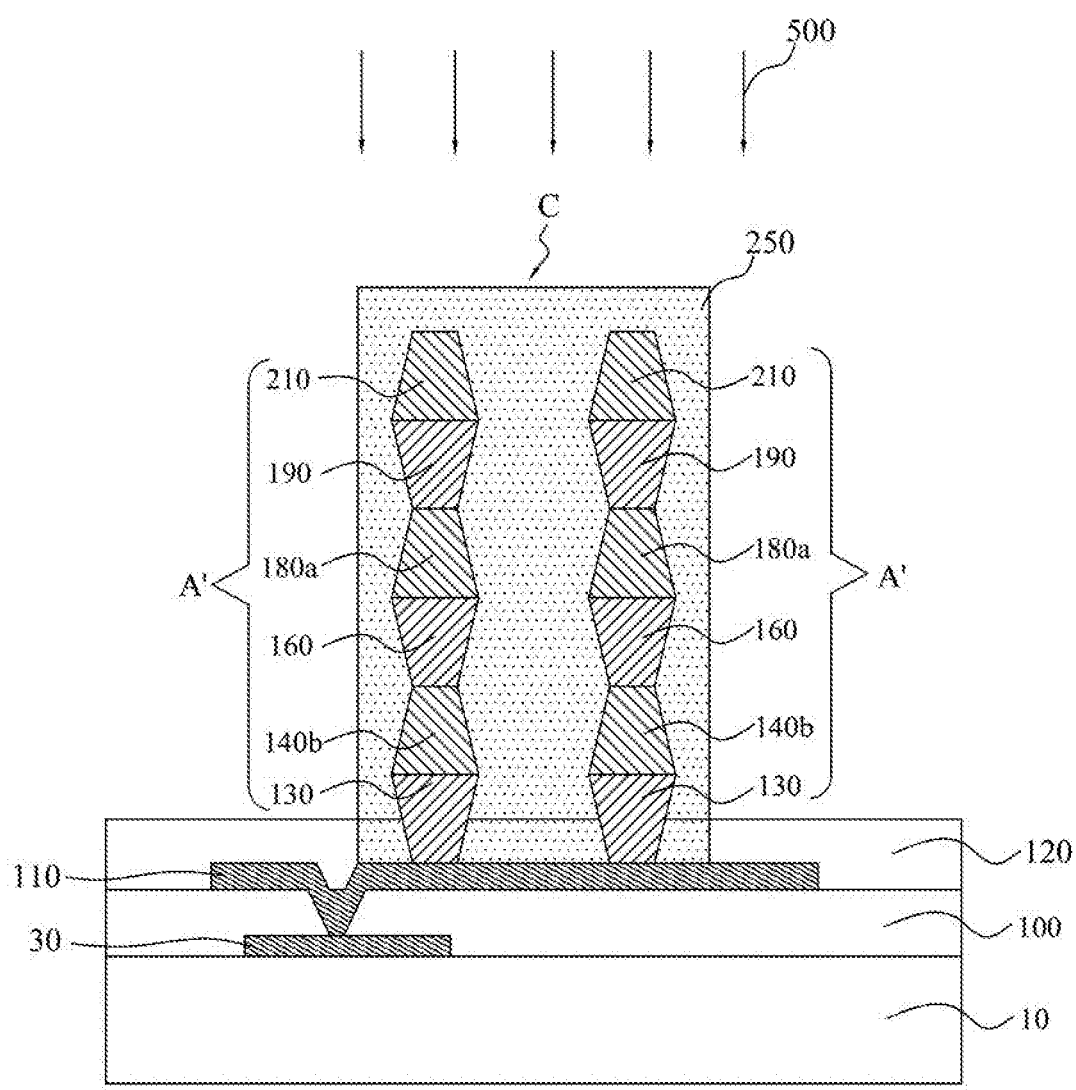

Referring to FIG. 19, an electroplating process 500 can be next performed to form a metal layer 250 over the side and top surfaces of the metal stacks A' to physically combine the metal stacks A', thereby forming these metal stacks A' into a metal probe C. In this present embodiment, the electroplating process 500 can be, for example, an electroless plating process, and the metal layer 250 may comprise nickel, palladium, gold, and alloys thereof. In addition, the thickness of each film layer can be appropriately adjusted, so that the formed metal probe C may have an aspect ratio of 1:1 to 5:1.

Figure 20:
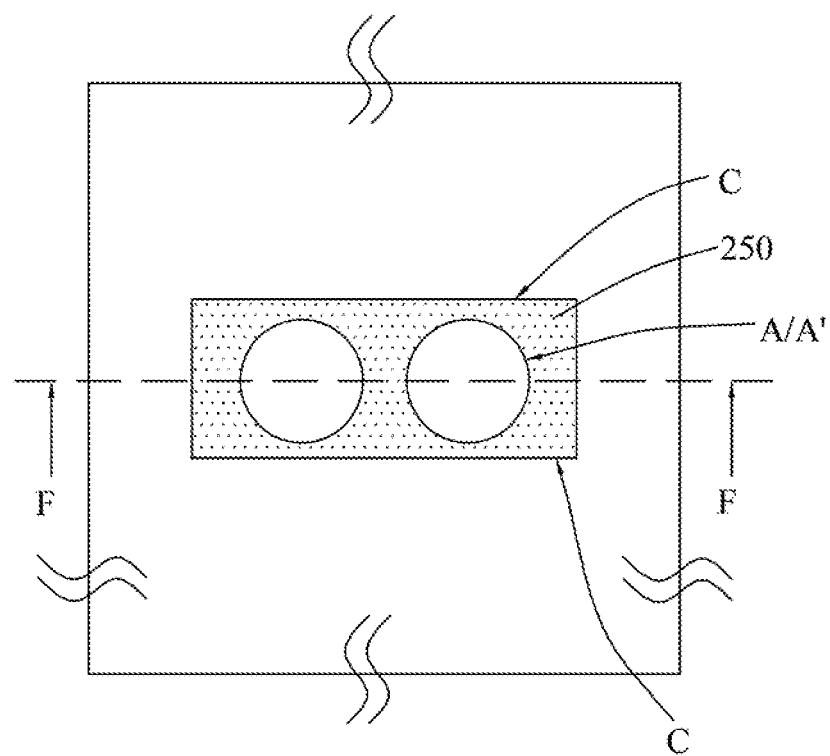
FIG. 20-22 are top schematic views of a metal probe structure in accordance with several different embodiments of the present invention.
Figure 21:
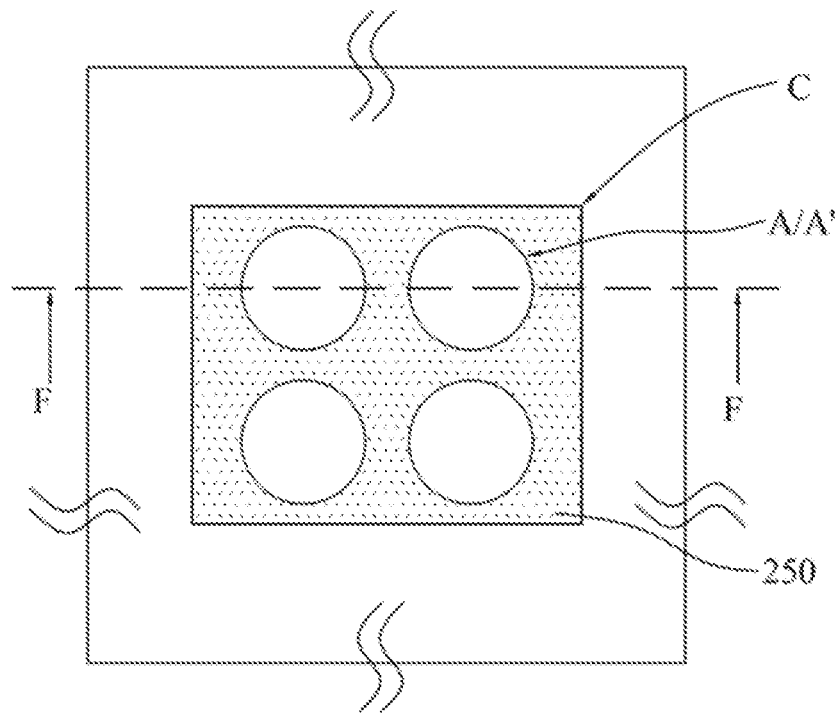
Figure 22:
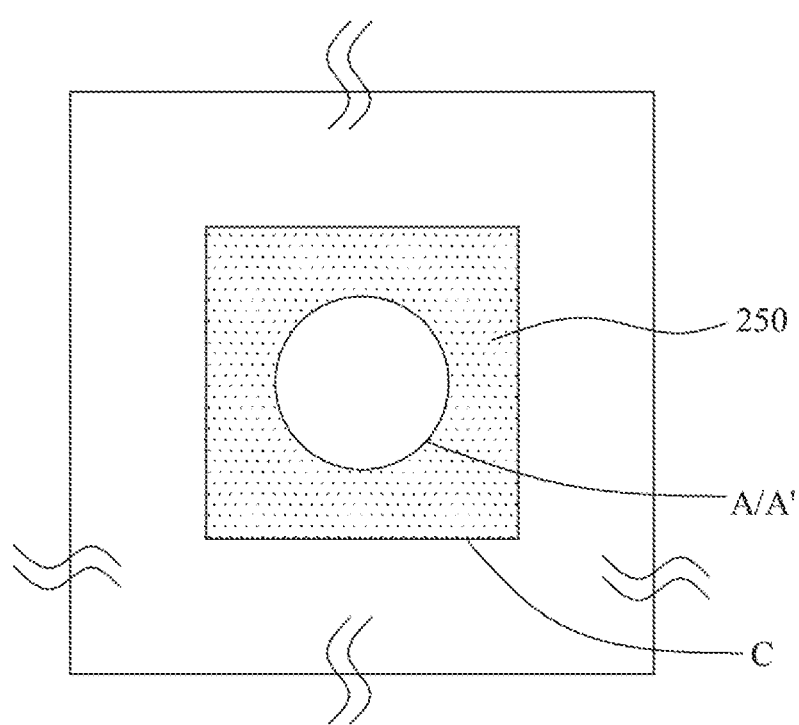

FIG. 20-22 show top schematic views of metal probe structures in accordance with several embodiments of the present invention.

Referring to FIG. 20, a top view of one of the metal probe structures shown in FIGS. 9 and 19 is shown. Here, the metal probe C in the metal probe structure is composed of a metal layer 250 over a side and top surfaces of two metal stacks A/A' and the two metal stacks A/A', and the cross-sectional view shown in FIGS. 9 and 19 mainly show the cross-sectional view along the line F-F in FIG. 20.

In addition, referring to FIG. 21, another top view of the metal probe structure shown in FIGS. 9 and 19 is shown. Here, the metal probe C in the metal probe structure is composed of a metal layer 250 over a side and top surfaces of four metal stacks A/A' and the four metal stacks A/A', and the cross-sectional view shown in FIGS. 9 and 19 only partially show the cross-sectional view of the two metal stacks A/A' along the line F-F in FIG. 21.

Furthermore, please refer to FIG. 22, which shows another schematic diagram of the metal probe structure shown in FIGS. 9 and 19. In other embodiments, the metal probe C of the metal probe structure shown in FIGS. 9 and 19 may be composed only of the metal layer 250 over a side and top surfaces of a metal stack A/A' and the metal stack A/A', and the cross-sectional views shown in FIGS. 9 and 19 only partially show the profile of a metal stack A/A' along the line F-F in FIG. 22.

In summary, the method for fabricating the metal probe structure of the present invention and the metal probe structure formed by thereof is a composite metal probe structure made of a plurality of metal components formed by stacking a plurality of metal components and a metal layer physically connecting the metal stacks. In this way, properties of the metal probe structure including but not limited to such as the material, the number of layers, the pitch, and the aspect ratio of the metal stack and the metal layer can be designed and adjusted according to the type of the test wafer, thereby providing a metal probe with good reliability, electrical conductivity, heat dissipation and/or mechanical strength than the metal probe used in the conventional probe card.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A metal probe structure, comprising:
   a multi-layer substrate;
   a first flexible dielectric layer disposed over the multi-layer substrate, having a conductive layer formed thereover;
   a second flexible dielectric layer disposed over the first flexible dielectric layer, covering the conductive layer;
   a plurality of first metal components disposed over the conductive layer and partially in the second flexible dielectric layer, wherein the first metal components have a maximum width of about 5 to 200 micrometers; and
   a metal layer, wherein the metal layer is located over a side surface and a top surface of the plurality of first metal components to physically connect to the first metal components, thereby forming a metal probe with the plurality of first metal components.

2. The metal probe structure of claim 1, wherein the first metal components are stacked from bottom to top.

3. The metal probe structure of claim 1, wherein the first flexible dielectric layer and the second flexible dielectric layer comprise polyimide.

4. The metal probe structure of claim 1, wherein the first metal components comprise copper or aluminum.

5. The metal probe structure of claim 1, wherein the metal layers comprise nickel, palladium, gold, or alloys thereof.

6. A metal probe structure, comprising:
   a multi-layer substrate;
   a first flexible dielectric layer disposed over the multi-layer substrate, having a conductive layer formed thereover;
   a second flexible dielectric layer disposed over the first flexible dielectric layer, covering the conductive layer;
   a plurality of metal stacks respectively disposed over the conductive layer and partially located in a second flexible insulating layer, wherein the metal stacks respectively comprise a plurality of first metal components and a plurality of second metal components that are interleaved with each other from bottom to top, wherein the first metal components have a maximum width of about 5 to 200 micrometers; and
   a metal layer over a side and a top surface of the plurality of metal stacks to physically connect to the metal stacks, thereby forming a metal probe with the plurality of metal stacks.

7. The metal probe structure of claim 6, wherein the first flexible dielectric layer and the second flexible dielectric layer comprise polyimide.

8. The metal probe structure of claim 6, wherein the first metal components and the second metal components comprise different materials.

9. The metal probe structure of claim 8, wherein the first metal components comprise copper or aluminum, and the second metal components comprise nickel, palladium, gold, and alloys thereof.

10. The metal probe structure of claim 6, wherein the metal layer comprises nickel, palladium, gold, and alloys thereof.

11. A method for fabricating a metal probe structure, comprising steps of:
    providing a multi-layer substrate having a first flexible dielectric layer and a conductive layer sequentially formed thereover;
    forming a second flexible dielectric layer over the first flexible dielectric layer, covering the conductive layer;
    forming a plurality of first openings in the second flexible dielectric layer, wherein the first openings respectively exposing a portion of the conductive layer;
    forming a patterned photoresist layer over the second flexible dielectric layer, wherein the patterned photoresist layer has a plurality of second openings respectively located over the first openings, and the second openings respectively expose the first openings and the portion of the conductive layer exposed during formation of the first openings;
    forming a first metal component in each of the first openings, wherein the first metal component respectively fills the first openings and physically contacts the conductive layer;
    removing the patterned photoresist layer; and
    performing an etching process, removing a portion of the second flexible dielectric layer to expose a portion of the first metal components to form a metal probe, wherein the first metal components have a maximum width of about 5 to 200 micrometers.

12. The method of claim 11, before performing the etching process, further comprising the following steps:
    forming a third flexible dielectric layer over the second flexible dielectric layer, covering the first metal components; and
    forming another first metal component over the first metal component to form a plurality of metal stacks comprising a plurality of first metal components sequentially stacked;
    wherein the third flexible dielectric layer and a portion of the second flexible dielectric layer are removed during the etching process, and the metal stacks comprising a portion of the first metal components stacked from bottom to top to form a metal probe.

13. The method of claim 11, further comprising a step of performing an electroplating process to form a metal layer over a side and top surface of the first metal components to forms the metal probe with thereof.

14. The method of claim 13, wherein the metal layer comprises nickel, palladium, gold, and alloys thereof.

15. The method of claim 11, further comprising a step of performing an annealing process to metal stacks before performing the etching process.

16. The method of claim 11, wherein the first flexible dielectric layer and the second flexible dielectric layer comprise polyimide.

17. The method of claim 11, wherein the first metal components are formed by evaporation deposition.

18. The method of claim 11, wherein the first metal component comprises copper or aluminum.

* * * * *